United States Patent [19]
Morgan et al.

[11] Patent Number: 6,017,827
[45] Date of Patent: Jan. 25, 2000

[54] SYSTEM AND METHOD FOR MIXING A GAS INTO A SOLVENT USED IN SEMICONDUCTOR PROCESSING

[75] Inventors: Paul A. Morgan, Boise; Jonathan C. Morgan, Nampa, both of Id.

[73] Assignee: Micron Technology, Inc., Boise, Id.

[21] Appl. No.: 09/073,018

[22] Filed: May 4, 1998

[51] Int. Cl.$^7$ .................................................. H01L 21/00
[52] U.S. Cl. .............................. 438/745; 156/345; 216/83
[58] Field of Search .......................... 156/345 L, 345 LC; 438/745; 216/83; 261/58, 59, 64.3, DIG. 42

[56] References Cited

U.S. PATENT DOCUMENTS 5,431,861  7/1995  Nagahiro et al. .
5,464,480  11/1995  Matthews ............................ 438/745 X

OTHER PUBLICATIONS

James A. Plambeck, *Introductory University Chemistry I, Solutions and Solubility, Henry's Law and the Solubility of Gases*, Print–out of internet search conducted Aug. 13, 1997, URL: http://www.chem.ualberta.ca/courses/plambeck/p101/p01182.htm, 2 pages, Copyright 1995 (purported).

*Primary Examiner*—William Powell
*Attorney, Agent, or Firm*—Bradley M. Ganz

[57] ABSTRACT

The present invention generally provides a physical system and method for mixing a gas in a solvent to produce a solution used in the processing of a semiconductor work object. To dissolve a desired gas into a desired solvent, the solvent and gas are introduced into a pressurizable mixing module. The mixing module is selectably in communication with a process vessel. A pressure control mechanism, such as a valve, is located downstream of the mixing module to regulate the pressure and flow of solution or fluid in and leaving the mixing module to the process vessel. Preferably, the pressure control mechanism is located downstream and in communication with the process vessel. By adjusting the level of restriction of the pressure control mechanism the pressure of the gas in the mixing vessel above the solvent may be positively or negatively affected to vary the concentration of gas in solution based on Henry's Law. The system and method of this invention can be used to produce solutions of water and ozone having over 5 ppm ozone. It can also be used to produce water-ozone solutions having at least 16 ppm ozone at mixing temperatures over 15° C.

49 Claims, 5 Drawing Sheets

SYSTEM AND METHOD FOR MIXING A GAS INTO A SOLVENT USED IN SEMICONDUCTOR PROCESSING

BACKGROUND OF THE INVENTION

The present invention generally relates to a system for mixing a gas into a solvent used in semiconductor manufacturing. More particularly, the invention relates to a system and process for variably elevating the levels of ozone gas dissolved in water used in semiconductor manufacturing.

In semiconductor manufacturing, ozone may be added to water-based solvents where it can serve the role of oxidant in certain manufacturing processes. Ozone gas is not readily dissolved in water, but when it does, it is chemically unstable and converts quickly to oxygen. Therefore, it is difficult to store ozonated water solutions, so mixing and use generally occur on-site with contemporaneous use of the solution in a process.

In semiconductor manufacturing, an ozonated solvent may be introduced at various stages into process vessels where, for example, a silicon wafer is being prepared, conditioned and modified to become the final semiconductor product. Generally, ozonated solvents are used in etching and stripping phases. More particularly, it is used in processes known in the art as piranha, organic strip, silicon oxide, passivation, or other film or process-free treatments.

It is difficult to obtain ozone levels in excess of 5 ppm in deionized water at 20° C.–35° C. degrees, which is a range of ambient temperatures for water supplied by some kinds of deionized water sources used in semiconductor fabrication. If ozone concentrations could be raised significantly above 5 parts per million (ppm) in an efficient, economic way, such a system would be a significant advancement in semiconductor processing which should pave the way for faster and more effective processing of semiconductor materials and lowered production costs.

Unfortunately conventional techniques for ozonating solvents do not result in optimal levels of dissolved ozone in the solvent. For example, in one conventional mixing system, ozone is introduced from an ozone generator through a diffuser into an ozone-water contact reaction tank for mechanical mixing with solvent. The diffuser forms the ozone gas into bubbles. The amount of ozone that can be dissolved in water depends on the total surface area of bubbles introduced into the water; the smaller the bubble diameter, the greater the potential surface area in a given volume of water. There are at least two significant limitations to generating bubbles of relatively small diameter: (1) the ozone generator must be run under power conditions that are economically undesirable; and (2) conventional diffusers do not form bubbles of small enough diameter to result in optimal dissolution of ozone in water.

U.S. Pat. No. 5,431,861 describes a system intended for producing elevated concentrations of ozone in water. In the system, raw material water is pumped into a reaction tank. Mixing of water and ozone is facilitated by a first injection nozzles that injects ozone gas as fine bubbles into the raw material water in the ozone reaction tank. A second injection nozzle creates a water jet that circulates water in the reaction tank. According to the '861 patent, the water must be kept above 00 °C. and below 15° C. to achieve elevated levels of ozone dissolution. Consequently, the reaction tank includes a refrigerator/heat exchanger to chill the solution.

Unfortunately, the system of the '861 patent appears to require relatively complicated ejectors, circulation means, and refrigeration means. These features are not desirable in the semiconductor industry because they are unduly complicated and expensive. They are also difficult to implement into existing semiconductor manufacturing systems and appear to be unduly difficult to operate and maintain.

Consequently, there is still a need in semiconductor manufacturing for an ozonization system that produces relatively high levels of dissolved ozone in solvent without complicated or expensive additions to existing fabrication equipment and conditions. Ideally, the system should be constructed from existing semiconductor manufacturing equipment. It should also act to elevate ozone levels in water at ambient temperatures so that cooling systems are not necessary.

SUMMARY OF THE INVENTION

The present invention overcomes the disadvantages of the prior art in providing adjustable levels of ozone in solvent. It is relatively inexpensively and easily integrated into existing semiconductor manufacturing facilities. It does not require complicated equipment or difficult process conditions.

It is known that by increasing the partial pressure of a gas above a liquid, the concentration of gas in the liquid may be increased. Accordingly, the invention generally provides a physical system and method for mixing a gas in a solvent to produce a solution used in the processing of a semiconductor work object. To dissolve a desired gas into a desired solvent, the solvent and gas are introduced into a pressurizable mixing module. The mixing module is selectably in communication with a process vessel. A pressure control mechanism, such as a valve, is located downstream of the mixing module to regulate the pressure and flow of solution or fluid in and leaving the mixing module to the process vessel. Preferably, the pressure control mechanism is located downstream and in communication with the process vessel. By adjusting the level of restriction of the pressure control mechanism the pressure of the gas in the mixing vessel above the solvent may be positively or negatively affected.

The invention contemplates different embodiments of the mixing module. In one embodiment, the mixing module comprises a mixing tube and, optionally, a debubbler. The gas and solvent are introduced into the mixing tube, which may include any kind of conventional means for creating turbulence to facilitate mixing. The debubbler comprises a vessel for off-gassing bubbles that are present in the solution. Off-gassing may be facilitated by applying a negative pressure to the debubbler. In some photoresist processes using water-ozone solutions, the presence of ozone bubbles are not consequential. If the presence of bubbles is inconsequential, the mixing module does not require a debubbler.

In another embodiment of the invention, the mixing module comprises a vessel that holds compartmentalized membranes for containing a liquid solvent. The membrane compartments are impermeable to the solvent but are permeable to a gas to be dissolved in the solvent. Inside the vessel, the compartments are spaced from each other so that gas may be introduced into the vessel and diffuse through the membranes into the solvent. Preferably, the membrane compartments are arranged in a fashion that increases the surface area of the solvent. In the case of water-ozone solutions, tubular membranes made of PTFE are preferred.

The invention contemplates adjusting the partial pressure of gas above solvent, and hence the amount of gas dissolved in the solvent, by adjusting one or more system features. In one embodiment, the adjustments may be part of an automated system wherein the amount of gas mixed into the solvent in the mixing module is measured and converted to a data signal; the data signal is compared with a preset value representing a desired amount of gas in the solution; and the relative pressures of gas and solvent in the mixing module are adjusted to a desired value. The relative pressures can be affected by any one or more system features: adjusting the back pressure control mechanism to be more or less restricted; adjusting a pressure relief mechanism connected to the mixing module to be more or less restricted; increasing or decreasing the input pressure of solvent into the mixing module; and/or increasing or decreasing the input pressure of gas into the mixing module.

The system and method of this invention can be used to produce solutions of water and ozone having over 5 ppm ozone. It can also be used to produce water-ozone solutions having at least 16 ppm ozone at mixing temperatures over 15° C. Preferably the invention is used to produce ozone water solutions having ozone in an amount of at least 8 ppm, and even in excess of 20 ppm, at mixing temperatures of about 19° C.–35° C. The invention may be used to produce solutions in a bubbled or bubbless form.

Accordingly, such solutions may be introduced into a process vessel to process a semiconductor work object.

DETAILED DESCRIPTION OF THE INVENTION

While this invention is generally described in terms of ozone gas, it is expected that its teachings could be used to enhance the dissolution of other gases in a solvent where enhancement is desired in semiconductor manufacturing. In addition to water based solvents, solvents may include sulfuric acid-based solvents, and other solvents, into which ozone may be dissolved, and which are useful in semiconductor manufacturing.

For purposes of this invention, "dissolution", "dissolved" and like terms mean that when a gas, e.g., ozone gas, contacts a liquid solvent, the gas is captured in the liquid in either a bubbled or bubbless form.

Figure 1:
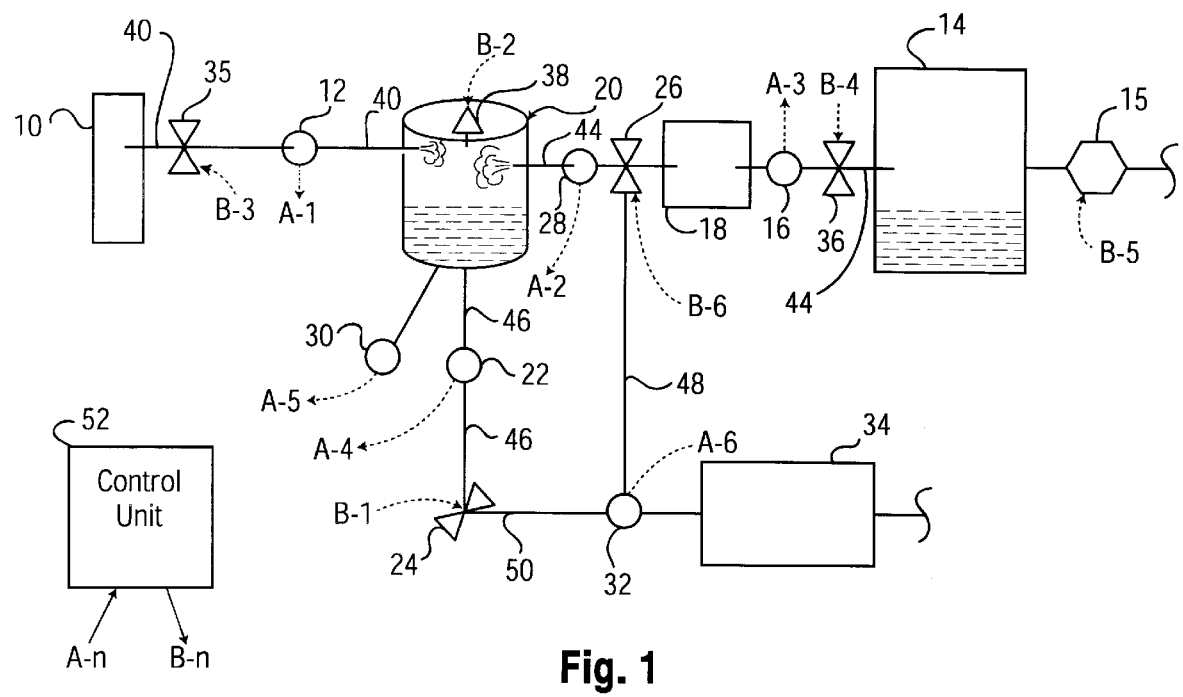
FIG. 1 shows a schematic view of a system for variably adjusting the amount of a gas in a solvent introduced into a vessel for processing a semiconductor substrate.

This invention, one embodiment of which is shown in FIG. 1, allows adjustment of ozone amount dissolved in solvent based on Henry's Law. That law states that the concentration of a solute gas in a solution is directly proportional to the partial pressure of that gas above the solution: p=k'cc. In this equation, "p" is the partial pressure of the gas, "c" is its molar concentration and "k'c" is the Henry's Law constant on the molar concentration scale. The k'c for ozone in deionized water, for example, as a function of temperature and pH, for example, is 6.35 at pH 7 and room temperature. Henry's Law generally describes the behavior of gases dissolving in liquids. While deviations are possible at relatively higher pressures and concentrations, it is well within the ordinary skill of persons in the art to determine whether and how to make adjustments for deviations from the general law.

FIG. 1 shows a gas supply unit 10, for example an ozone generator unit used to produce ozone gas. The gas-supply unit feeds gas to a mixing module 20. The mixing module receives a solvent, e.g., deionized water from a solvent vessel or source 14. Mixing module 20 is preferably a pressurizable vessel into which ozone and solvent are introduced at predetermined pressures and flow rates. A pump 15 may be used to drive solvent from the solvent source 14 to the mixing module 20 or other system components. In this invention, a process vessel is where a "work object" is processed. "Work objects" means objects, including, wafers, die and packaged parts, incorporating, in whole or part, silicon substrates, and other known or discovered semiconductor materials, components, and assemblies, including, for example, silicon-on-insulator (SOI), silicon-on-sapphire (SOS), thin film transistor (TFT) materials, or germanium, periodic group III–IV materials, II–VI materials, heteromaterials (II,III, V, VI), and conductive glasses.

Preferably a degassifier 18 is positioned between the solvent source 14 and the process vessel 34 to remove any undesired gases present in the solvent before it enters other system components such as the mixing module or process vessel. A degassifier (or debubbler) removes unwanted dissolved gases from the solvent before the solvent is introduced into the mixing module 20. Means for degassing solvents are well known in the art and need not be elaborated on here.

Figure 2:
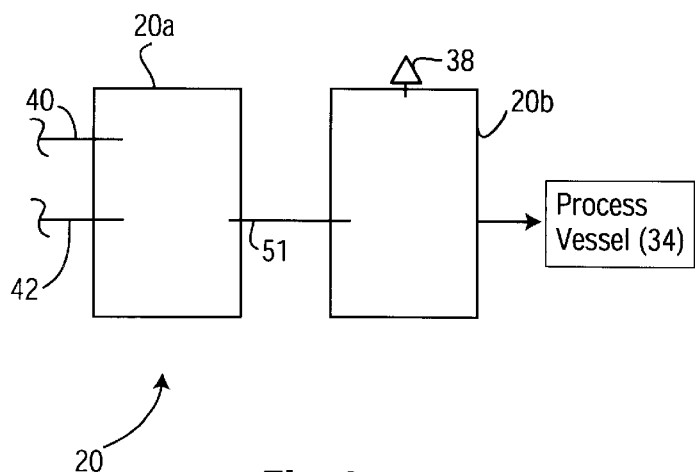
FIG. 2 shows a first embodiment of a mixing module, comprising a mixing tube and debubbler, for use in the system of FIG. 1.
Figure 3:
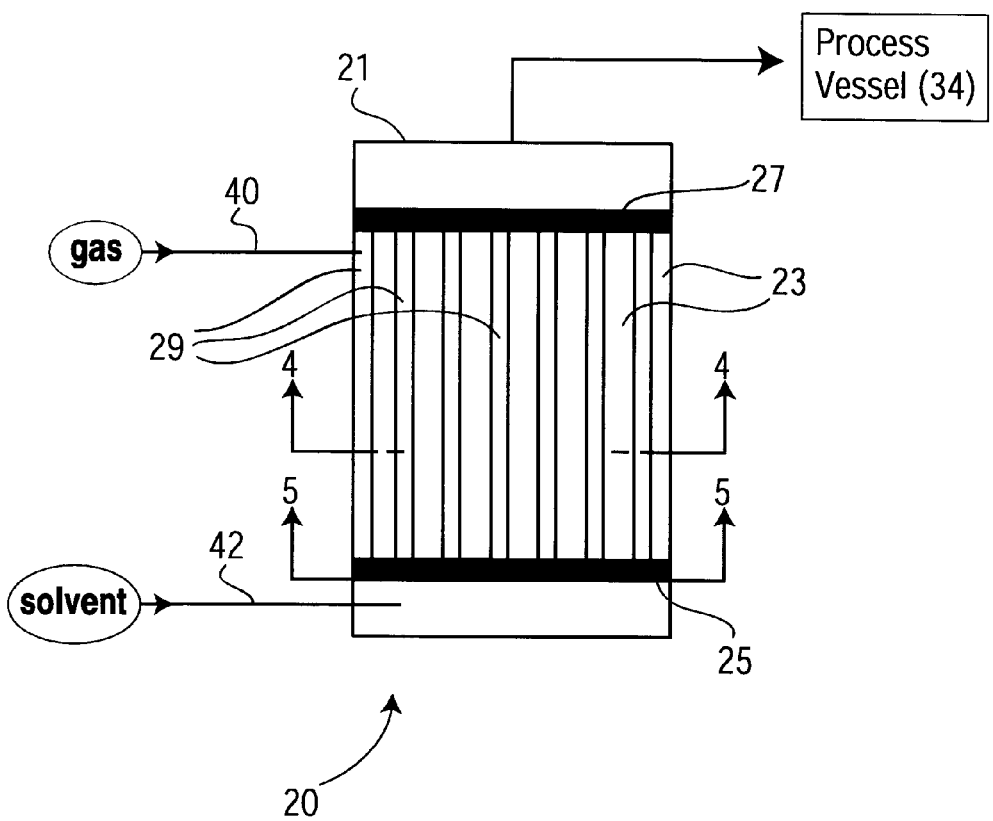
FIG. 3 shows a second embodiment of a mixing module for use in the system of FIG. 1.

The system components of this invention are in fluid communication with each other by the conduit lines shown in the FIGS. 1–3. Line 40 establishes a channel for flow of a gas from a gas reservoir such as ozone generator 10 to mixing module 20. Line 44 also establishes a flow channel between solvent source 14 and a degassifier 18. Line 44 establishes flow channel between the degassifier 18 to mixing module 20. Line 46 establishes a flow channel between mixing module 20 to pressure control mechanism 24, and continues as line 50 downstream of the pressure control mechanism 24 into process vessel 34. Flow control mechanisms, such as valves, may be included at various locations in the system to regulate flow of liquid or gaseous fluids. For example, flow control mechanism 36 is a valve that regulates the flow of solvent from solvent source 14. Flow control mechanism 35 regulates flow of gas from the gas reservoir. Flow control mechanism 26 flow solvent through conduit 44 to the mixing module 20 or to the process vessel 34. Additional or alternatively positioned flow control mechanisms can also be added into the system, as will be readily recognized by person skilled in the art.

Accordingly, the pump 15 and/or gas supply unit pressurizes the system through at least the process vessel 34 via the various conduit lines. It will be recognized that the location of pump 15 is only one example of a pumping arrangement and that additional pumps and pump positions are possible. It will also be recognized that fluid flow may also be driven by substitutes for pumps such as pressurized gases, piston cylinders, or gravity-based fluid based systems.

The fluid that enters the process vessel may exit the vessel and the system to a drain, for example, or it may be returned to a predetermined location in the system.

A gas analyzer 12 may be placed between the ozone generator 10 and the mixing module 20 to monitor the amount of ozone gas flowing into module 20. Similarly, between the solvent source 14 and the mixing module 20, a flow meter 16 may be provided to monitor the flow rate of solvent into the module 20. A pressure sensor 28 monitors the pressure of solvent feeding into mixing module 20.

A pressure sensor 30 may be positioned associated with the mixing module 20 to measure the pressure of $O_3$ inside module 20. A variable pressure relief mechanism 38, such as a vent or valve, may be in communication with the internal pressure of gas inside module 20 to vent gas and maintain the internal pressure of the module at a predetermined level. Pressure gauge 22 may be located at the outlet of module 20, or downstream from it, to measure the pressure of solution flowing out of the module.

A gas analyzer 32 for measuring the amount of ozone or other gas dissolved in the solution may be positioned in-line between the mixing module 20 and the process vessel 34. Preferably the analyzer should be an inline analyzer. One example of such an analyzer is sold under the trade name "DFFOZ dissolved Ozone Sensor" and is available from InUSA, Inc., Needham, Me.

A bypass valve 26 may be included in the system between the solvent source 14 and the mixing module 20. The bypass valve 26 enables solvent to be diverted directly to the process vessel 34 without going through the mixing module 20. Such diversion may be selected in process conditions where ozone is not desired. One case where diversion may be used, for example, is in certain rinsing processes.

A pressure control mechanism 24 for controlling solution backpressure is located downstream from mixing module 20. The pressure control mechanism 24 is preferably an adjustable valve. However, this invention contemplates various other means of creating back pressure including: reverse-flow pumps; baffles; filter media; or other physical occlusions such as crimped sections of conduit, elbow turns in the conduit, or other mechanical occlusions to flow through the conduit.

By downwardly restricting the size of the opening controlled by valve 24, the pressure upstream of the valve and within the mixing module 20 may be increased if other system parameters, e.g., flow rates of solvent and/or gas into the mixing module 20, remain relatively constant. (This increase in pressure on the upstream side of the pressure control mechanism may be referred to herein as "back pressure"). In accordance with Henry's Law and as indicated in the example embodiment presented below, increasing the back pressure acts to increase the partial pressure of gas above the solvent, elevating the amount of the gas dissolved in the solution. Likewise, unrestricting the valve would result in a relative decrease in the amount of gas dissolved in the solvent, all other parameters being constant. Preferably, the pressure control mechanism is located downstream of the process vessel.

Regulation of the gaseous ozone input pressure versus the solvent pressure allows a greater partial pressure of gaseous ozone to solvent. In the system shown in FIG. 1, ozone levels in solution may be upwardly adjusted by adjusting the pressure control mechanism 24 to result in a constant solvent pressure upstream of the pressure control mechanism 24, and a lower solution pressure from the pressure control mechanism 24 to the process vessel 34. Solvent pressure is thereby at a higher pressure in the mixing module than the maximum desired system pressure going into the process vessel. The relative pressures on each side of the control mechanism 24 are adjusted via the control mechanism 24 such that the desired flow rate of solution is achieved (flow rate is dependent on the process being carried out). However, the pressure control mechanism 24 is not limited to the location shown in FIG. 1. It may be located downstream of the process vessel 34 so that there is not a separation of gas from the solvent as the solvent is transported into the process vessel 34. This may be an issue when there is a large pressure differential from one side of the pressure control mechanism 24 to the other, or in processes where the presence of bubbles in the solution is undesirably.

The pressure of gas above the solvent and the level of solvent in the mixing module 20 may be adjusted through the pressure relief mechanism 38. The mechanism may be programmed or manually adjusted to become more open or closed depending on desired pressures of gas and levels of fluid in the mixing module. Accordingly, gas pressure in mixing module 20 may be downwardly adjusted by unrestricting pressure control mechanism 24 and/or by releasing pressure through relief mechanism 38. Similarly, gas pressure and fluid levels are increased if the pressure relief mechanism is restricted, or if it is left in a constant setting as pressure control mechanism 24 is restricted. Thus, regulation of the pressure relief mechanism 38 helps achieve a desired balance between the liquid and gas phases in the mixing module.

By monitoring the pressure of ozone or other gas in the mixing module, and/or the amount of ozone entering the process vessel 34 via sensors or analyzers, such as sensor 30 or analyzer 32, the amount of ozone in solvent may be variably adjusted. For example, by connecting the sensors and analyzers to a control mechanism, which may be in the form of a centralized or decentralized mechanical or automated control unit 52, the appropriate control mechanisms, valves and pumps for controlling the flow and pressure of system materials and components may be regulated. A microprocessor or computer may be used as the centralized or decentralized control unit 52. The control unit may receive data signals from one or more system components. These data signals may be electronically transmitted by, for example, hard wires, fiber optics, or infrared means. The control unit processes the signals, and issues commands to one or more system components based on the processed signals so that a solution with a desired degree of ozonation is fed from the module 20 into the process vessel 34 where a semiconductor work object is being processed. In the system shown in FIG. 1, the control unit 52 may receive input from one ore more of: analyzer 12, pressure sensor 28, flow meter 16, pressure sensor 22, pressure sensor 30, analyzer 32, and any other monitoring device that may be made part of the system. The analyzers and pressure sensors are in communication with the control unit via couplers A-1 to A-6, respectively, as shown in FIG. 1. Based on a signal or signals it processes, the control unit 52 may issue commands to one or more of: the pressure control mechanism 24, pressure relief mechanism 38, valve 26, valve 35, valve 36, pump 15, and any other adjustable component made part of the system,. The control unit issues commands to the adjustable components via couplers, B-1 to B-5, respectively, as shown in FIG. 1.

All components of the system, and their installation, and manner of use, except as otherwise noted herein, are standard items available from various companies that supply the semiconductor industry.

Figure 11:
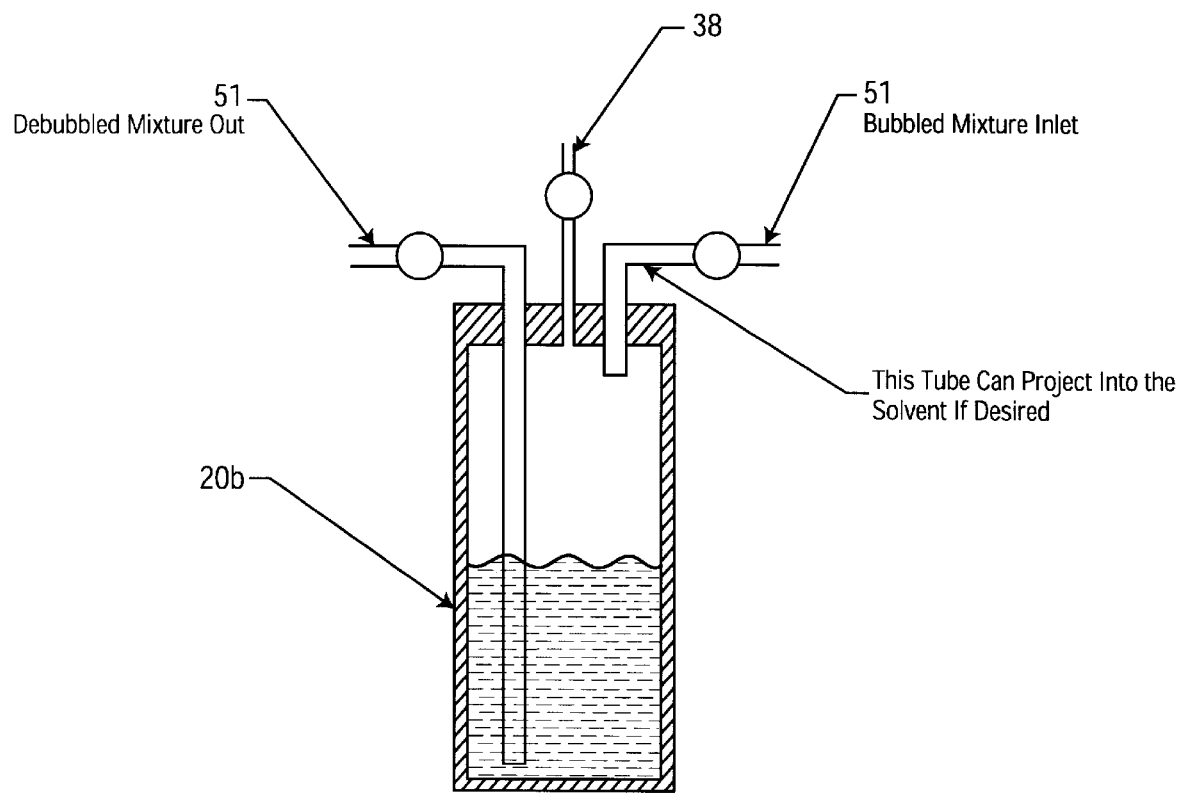
FIG. 11 shows a section side view of the debubbler of FIG. 2.

In one example of an embodiment of the invention, as shown in FIGS. 2 and 8–11, gaseous ozone and a liquid solvent are introduced into a mixing module 20 comprising a mixing tube 20a and debubbler unit 20b. The mixing tube comprises a vessel where solvent and gas are initially mixed under turbulence. A ribbon 21 of, for example, quartz, TEFLON polymer, or plastic may provide the turbulence. Solvent and gas are fed into to the mixing tube via lines 44 and 40, respectively. Turning to FIG. 11, the debubbler 20b comprises a tank with a regulated pressure vent 38. The mixed solution from mixing tube 20a flows into the debubbler via Line 51. The debubbler serves to reduce the presence of bubbles from the solution. The presence of bubbles in solution is known to negatively impact certain processes. Debubbled solution from module 20b flows to process vessel 34 via conduit line 46. Pressure control mechanism 24 is downstream of the debubbler 20b. Both the debubbler and mixing tube are subject to the backpressure regulated by the pressure control mechanism 24. Regulation of the gaseous ozone input pressure versus the solvent pressure is controlled through a backpressure control valve 24 downstream from the mixing module 20 in the same manner as described above generally for mixing vessel 20. Likewise pressure relief mechanism 38 may be used to downwardly adjust the pressure of gas in the debubbler.

Figure 4:
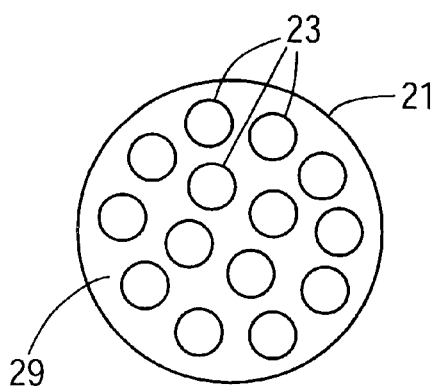
FIG. 4 shows a cross section taken along line 4—4 in FIG. 3
Figure 5:
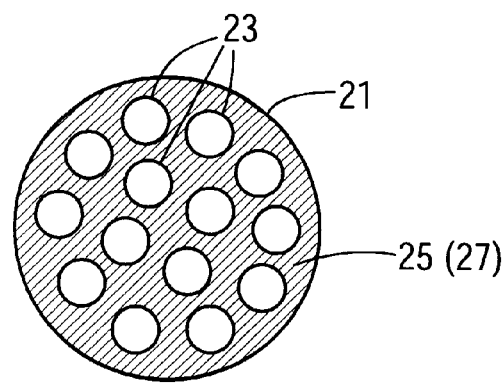
FIG. 5 shows a cross section taken along line 5—5 in FIG. 3.
Figure 6:
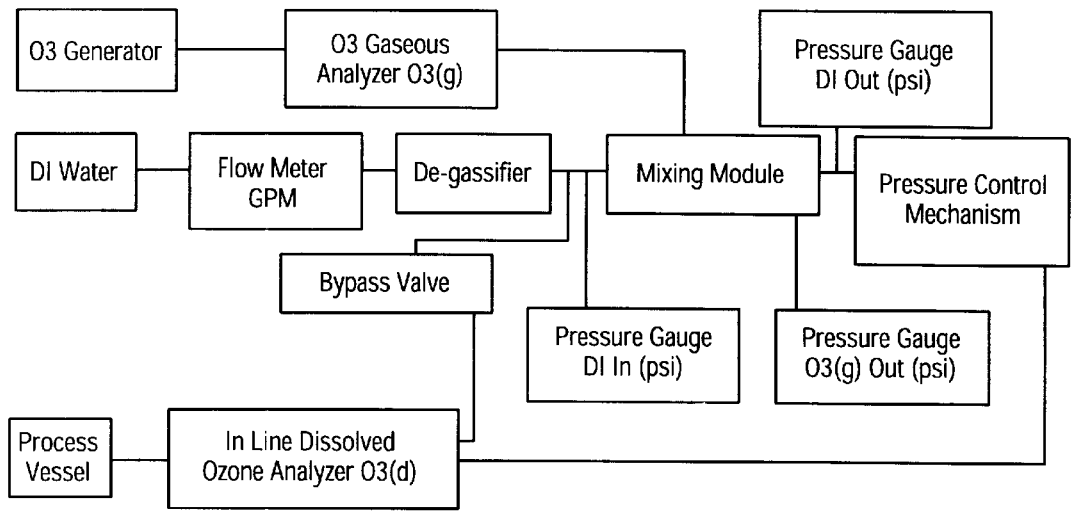
FIG. 6 is a block diagram of an example ozonation system according to this invention that has a mixing module consistent with FIG. 3.
Figure 7:
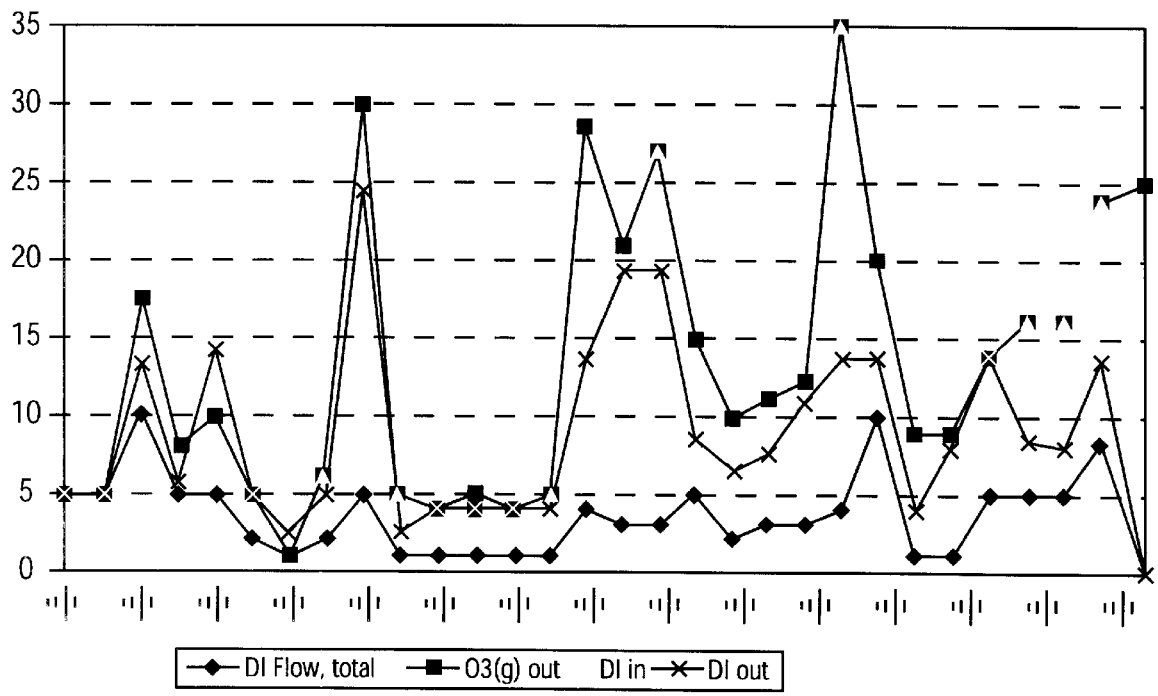
FIG. 7 is a graphical representation of the data from Table 3 of this specification generated during operation of an example ozonation system according to this invention.
Figure 8:
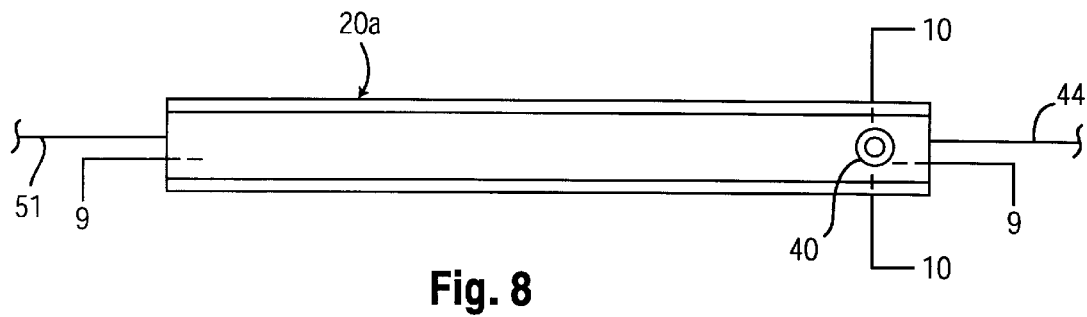
FIG. 8 shows a side view of a vessel for the introduction and turbulent mixing of ozone and solvent.
Figure 9:
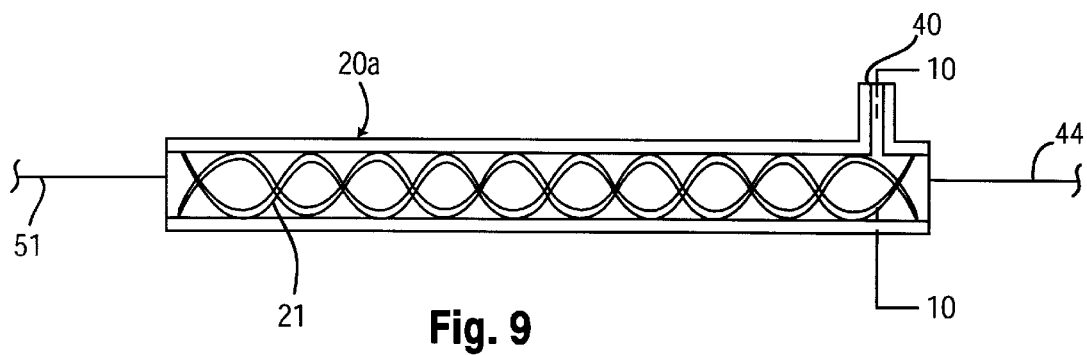
FIG. 9 shows a section view of the vessel of FIG. 8 taken along line 9—9.
Figure 10:
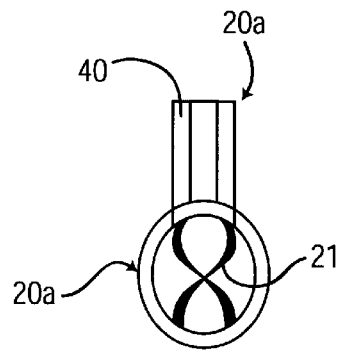
FIG. 10 shows a section view of the vessel of FIG. 8 taken along line 10—10

In another example embodiment of the invention seen in FIG. 3, the mixing module 20 comprises a unit for containing a liquid solvent on one side of a gas-permeable/solvent-impermeable membrane and a diffusible gas on the other side. The membrane material should not be subject to ozone degradation, or degradation from the solvent. For purposes of this invention, this kind of a mixing module may be referred to herein as a "gas contactor," or more specifically, an "ozone contactor". One example of a suitable membrane material and arrangement is shown in FIG. 3 as a cluster of tubes 23, preferably of PTFE (polytetrafluoroethylene) contained in a pressurizable cylinder 21, preferably of PVDF (polyvinylidenefluoride) The tubes are enclosed in a cylinder 21. The tubes should be arranged so that gas introduced into the cylinder can surround each tube in whole or part. Conduit line 42 feeds solvent into cylinder 21 having closed ends. Preferably the cylinder is upright, as shown in FIG. 3, and the solvent enters the lower portion of the cylinder. The cylinder includes barriers 25 and 27 and so that solvent introduced into the cylinder 21 flows into and through tubes 23 and not into the space 29 intended for gas surrounding the tubes FIG. 4 shows a cross section taken along line 4—4 in FIG. 3. This cross section shows open space 29 between the tubes for gas to surround the tubes 23, as discussed below. FIG. 5 shows a cross section taken along line 5—5 in FIG. 3. This cross section shows the barrier layer 25 filling the space 29 between tubes 23 to preclude the solvent from entering the space. At the opposite end of the cylinder, barrier layer 27 is arranged relative to the tubes in the same fashion as barrier 21.

Conduit line 40 feeds gas into cylinder 21 between barriers 25 and 27 to place gas in the spaces 29 surrounding tubes 23 in the cylinder 21. Preferably the gas is first introduced into the upper portion of the cylinder, as shown in FIG. 3. The tubular membranes 23 increase the surface area of the solvent so that the gas may diffuse into it, thereby facilitating the dissolution process. The solution of gas and solvent are then fed to the process vessel through conduit line 46, preferably exiting from the upper portion of the cylinder.

A pressure relief mechanism 38 may be included on the cylinder 21 to vent gas generally in the manner described above for a mixing module 20. Preferably the pressure relief mechanism is located at a lower portion of the cylinder, as shown in FIG. 3. Also in the same manner generally described above, solvent backpressure may be used to increase or decrease the partial pressure of a gas in a contactor 21. For example, restricting valve 24 downstream from the cylinder 21 would increase the backpressure of solvent in the cylinder thereby facilitating the diffusion and dissolution of ozone gas through the membrane and into the solvent. A gas contactor suitable for use as a mixing module may be obtained from W. L. Gore & Associates., Sudbury, Mass.

The relationship between the gas pressure and the liquid pressure is dependent on the desired system response level in the solvent. The first is knowing the higher the partial pressure of the gas, i.e. the greater the concentration of the desired gas, the more efficient the mass transfer is of the gas to the liquid. By increasing the liquid pressure (this does not affect the volume of the liquid) we can increase the gas pressure (this decreases the volume of the gas and thus increases the concentration of the gas over a given area). The result is to effectively increase the effective contact area of the gas/liquid interface and in turn increase the efficiency of the process.

Operation of Example Embodiment

The inventors' believe that the foregoing disclosure independently establishes the operation and usefulness of this invention. To help confirm their beliefs the following experiments and tests were conducted, which the inventors consider reasonably confirm their beliefs.

To evaluate the efficiency and effectiveness of the invention at dissolving gaseous ozone into DI water, a mixing module comprising a Gore® gas contactor for ozone, as generally described above was placed in the configuration shown in FIG. 4. The following table represents the factors and responses that were evaluated.

TABLE 1

| Factor | Response |
| --- | --- |
| Bubble vs. Bubble-less configuration | factor |
| DI water flow (GPM) | factor |
| DI water temperature 31° C. | fixed |
| DI water pressure in to contactor | factor |
| DI water pressure out from contactor | factor |
| Downstream valve position (relates to overall DI water pressure) | factor |
| $O_3$ (g) pressure out from contactor | factor |
| $O_3$ (g) wt. % (output from ozone gas supply unit) | fixed |
| $O_3$ (g) pressure source 35 psi. | fixed |
| $O_3$ (g) constituent components O2 @ 4 SLM N2 @ 40 SCCM | fixed |
| $O_3$ (d) level in the DI water (PPM) | response |

DI = deionized; GPM = Gallons Per Minute; SLM = Standard Liters per Minute SCCM = Standard Cubic Centimeters per Minute; PPM = Parts Per Million Experimental Setup A system for producing elevated levels of ozone in water was made according to the block diagram shown in FIG. 4 and generally according to FIGS. 1 and 3, and operated as described hereafter. The gas contactor was placed in an upright position downstream from means for degassifying the DI water and upstream of the process vessel.

In accordance with FIG. 3, DI water entered the gas contactor at its lower portion and exited the upper portion after mixing with ozone. The ozone (g) entered the gas contactor at its upper port and exited its lower port by a pressure relief mechanism. This caused an opposing flow condition, which is more efficient for ozone mass transfer to the liquid. Pressure gauges were placed at the DI input and the DI output ports of the contactor, and also at the ozone (g) output port of the contactor.

Fixed settings: $O_3$ (g) wt. %, 10, $O_3$ (g) pressure source, 35 psi $O_3$ (g) constituent components, O2 @ 4 SLM, N2 @ 40 SCCM.

DI water temperature, 31.1° C.

Data

The experimental conditions monitored or controlled were:

TABLE 2

Definition of Primary Parameters

| | | |
|---|---|---|
| Bubbles | yes or no | visual check for bubbles in the solvent flowing from the gas contactor |
| Pressure Control Mechanism | Restricted or Unrestricted | Pressure control valve for applying back pressure to the contactor "Unrestricted" means fully open. "Restricted" means semi-closed to achieve a pre-determined flow rate into the process vessel. |
| $O_3$ pressure relief mechanism | open or closed | controlled the $O_3$ gas pressure within the contactor |
| $O_3$ (d) | ppm | reading taken from the inline dissolved ozone analyzer |
| DI Flow | gpm | programmed DI water flow into the mixing module |
| $O_3$ (g) Out | psi | pressure of the gaseous ozone in the contactor |
| DI In | psi | water pressure on the inlet side of the contactor |
| DI Out | psi | water pressure on the outlet side of the contactor |

TABLE 3

Run Data

| Bubbles Yes/No | DI Outlet Valve position | $O_3$ valve | O3(d) (ppm) | DI Flow, total (GPM) | $O_3$ (g) out (psi) | DI in (psi) | DI out (psi) |
|---|---|---|---|---|---|---|---|
| no | unrestricted | open | 2 | 5 | 5 | 12 | 5 |
| no | unrestricted | open | 2 | 5 | 5 | 11 | 5 |
| no | unrestricted | open | 2 | 10.5 | 18 | 20 | 14 |
| no | unrestricted | open | 3 | 5 | 8 | 12 | 5.5 |
| no | unrestricted | open | 4.4 | 5 | 10 | 14 | 14.5 |
| no | unrestricted | open | 5.9 | 2.1 | 5 | 6.2 | 4.6 |
| no | unrestricted | open | 6.1 | 1 | 1 | 5 | 2.5 |
| no | unrestricted | open | 6.3 | 2.1 | 6 | 6 | 4.6 |
| no | restricted | open | 6.5 | 5 | 30 | 32 | 25 |
| no | unrestricted | open | 7.3 | 1 | 5 | 5 | 2.5 |
| no | unrestricted | open | 7.6 | 1.1 | 4 | 5 | 4 |
| no | unrestricted | open | 7.6 | 1.1 | 4.5 | 5 | 4 |
| no | unrestricted | open | 7.7 | 1.1 | 4 | 5 | 4 |
| no | unrestricted | open | 8 | 1.1 | 5 | 5 | 4 |
| no | restricted | open | 8.4 | 4 | 29 | 32 | 14 |

TABLE 3-continued

Run Data

| Bubbles Yes/No | DI Outlet Valve position | $O_3$ valve | O3(d) (ppm) | DI Flow, total (GPM) | $O_3$ (g) out (psi) | DI in (psi) | DI out (psi) |
|---|---|---|---|---|---|---|---|
| no | restricted | open | 8.8 | 3 | 21.5 | 26 | 19.5 |
| no | restricted | open | 9.3 | 3 | 27 | 27 | 19.5 |
| yes | unrestricted | open | 12.5 | 5.2 | 15 | 16 | 8.5 |
| yes | unrestricted | open | 16.5 | 2.1 | 9.5 | 7.5 | 6.5 |
| yes | unrestricted | open | 16.9 | 3 | 11 | 10 | 7.5 |
| yes | unrestricted | open | 17 | 3 | 12 | 10 | 11 |
| yes | restricted | open | 17 | 4 | 35 | 35 | 14 |
| yes | unrestricted | open | 17.5 | 10 | 20 | 19 | 14 |
| yes | unrestricted | closed | 19 | 1 | 9 | 6.5 | 4 |
| yes | unrestricted | closed | 20 | 1.1 | 9 | 7 | 8.5 |
| no | unrestricted | closed | 20 | 5 | 14.5 | 15 | 14 |
| yes | unrestricted | closed | 20 | 5 | 16 | 16 | 8.5 |
| yes | unrestricted | closed | 21 | 5.2 | 16 | 16 | 8 |
| yes | unrestricted | closed | 22 | 8.5 | 24 | 24 | 14 |
| yes | unrestricted | closed | 75 | 0 | 25 | 0 | 0 |

The data points of Table 3 are graphically represented in FIG. 5.

Subsequent Testing

The gas contactor's performance concerning particles, particle streaking (bubble tracks) and oxide growth were evaluated by process tests.

Test #1 was a basic $O_3$ rinse. Two pmon wafers were pre-read and then processed through a DI+$O_3$ rinse at 5 GPM, 2.0 ppm $O_3$ (d) level, 32° C. Post particle measurements were recorded.

Test #2 was a 25 angstrom HF etch followed by a 3 minute $O_3$ rinse using the same conditions as test #1.

Test #3 was a 25 angstrom HF etch followed by a 20-minute $O_3$ rinse.

| Test # | Process | Pre Reading | Post Reading | Delta | Oxide Thickness (post) |
|---|---|---|---|---|---|
| 1 | $O_3$ Rinse Only | 3 | 24 | 21 | |
| 1 | $O_3$ Rinse Only | 11 | 31 | 20 | |
| 2 | 25A HF + $O_3$ Rinse | 25 | 41 | 16 | 6.84 |
| 2 | 25A HF + $O_3$ Rinse | 39 | 82 | 43 | 6.94 |
| 3 | 25A HF + $O_3$ Rinse | 311 | 334 | 23 | 7.53 |
| 3 | 25A HF + $O_3$ Rinse | 147 | 274 | 127* | 7.58 |

*Wafer #2 of test #3 had a scratch, which estimated at 90–100 counts.

Conclusions

By adjusting the pressure control mechanism at predetermined levels of solvent flow/pressure, the invention may achieve elevated levels of dissolved ozone in excess of 20 PPM. Advantageously, these levels were achieved in a DI water source having an ambient temperature of 31.1° C. No refrigeration or elaborate mixing of solvent was needed. These levels was achieved in both bubble and non-bubble modes. The system was basically particle neutral. Steady state readings were achieved within 90 seconds. In the no bubble mode, no particle streaks were recorded on the pmon wafers. Accordingly, the gas contactor would work very well in a steady state application like on an overflow rinse tank. The contactor never wetted even with a significant positive water pressure differential, ~20 psi or greater.

While this invention is described in terms of certain preferred embodiments, it will be understood by and apparent to persons skilled in the art reviewing this specification that there are various other embodiments and modifications possible that are within the scope of this invention's teachings.

What is claimed is:

1. A method for mixing a gas in a solvent to produce a solution used in the processing of a semiconductor work object, comprising:

introducing a solvent into a pressurizable mixing module; introducing a gas into the mixing module, the mixing module selectably being in communication with a pressure control mechanism;

setting the pressure control mechanism to a degree of restriction to maintain the pressure of the gas in the mixing vessel at a level, the pressure control mechanism being located downstream of the mixing module; and introducing the solvent and gas from the mixing module into the process vessel.

2. The method of claim 1 wherein the mixing module comprises a mixing tube and debubbler.

3. The method of claim 1 wherein the mixing module comprises a gas contactor.

4. The method of claim 3 wherein the gas contactor includes a one or more membrane compartments, the membranes comprising PTFE.

5. The method of claim 1 wherein the solvent comprises water.

6. The method of claim 1 wherein the gas comprises ozone.

7. The method of claim 1 wherein the solvent comprises water and the gas comprises ozone.

8. The method of claim of claim 1 wherein the pressure control mechanism is located between the process vessel and the mixing module.

9. The method of claim 1 wherein the pressure control mechanism is located downstream from the process vessel.

10. A method of introducing a solution having an amount of a dissolved gas into a semiconductor process vessel, comprising:

placing a semiconductor process vessel in communication with a mixing module;

measuring the pressure of the gas in the mixing module;

comparing the measurement with a preset value representing a desired partial pressure of gas in the mixing module;

adjusting the partial pressure of the gas in the mixing module to reach a desired amount of gas dissolved in the solvent; and introducing the solvent with the desired amount of dissolved gas into the process vessel.

11. The method of claim 10 wherein the partial pressure of gas is adjusted through a pressure control mechanism in communication with the mixing module.

12. The method of claim 10 wherein the partial pressure of gas is adjusted through a pressure relief mechanism associated with the mixing module.

13. The method of claim 10 wherein the partial pressure of gas is adjusted by changing the input flow rate of the gas being introduced into the mixing module.

14. The method of claim 10 wherein the partial pressure of gas is by adjustment of two or more of a pressure control mechanism, the input flow rate of the gas being introduced into the mixing module, the input flow of solvent into the mixing module, and a pressure relief mechanism associated with the mixing module.

15. The method of claim 14 wherein the measurement of the partial pressure of gas in the mixing module is converted to a first data signal, the first data signal being compared with the preset value to generate a second data signal, the second data signal determining the degree of adjustment needed to arrive at the desired partial pressure of gas.

16. The method of claim 14 wherein the gas comprises ozone and the solvent comprises water.

17. A method of introducing a solution having an amount of a dissolved gas into a semiconductor process vessel, comprising:

placing a semiconductor process vessel in communication with a mixing module;

measuring the amount of gas mixed into the solvent;

comparing the measurement with a preset value representing a desired amount of gas in the solution;

adjusting the relative pressures of gas and solvent in the mixing module to desired values; and introducing the solvent with the desired amount of dissolved gas into the process vessel.

18. The method of claim 17 wherein the relative pressures of gas and solvent are set by adjusting a pressure control mechanism in communication with the mixing module.

19. The method of claim 17 wherein the relative pressures of gas and solvent are set by adjusting a pressure relief mechanism associated with the mixing module.

20. The method of claim 17 wherein the relative pressures of gas and solvent are set by adjusting the input flow rate of gas being introduced into the mixing module.

21. The method of claim 17 wherein the relative pressure of gas and solvent is set by relative adjustments of two or more of the back pressure control mechanism, the input flow of gas into the mixing module, the input flow of solvent into the mixing module, and a pressure relief mechanism connected to the mixing module.

22. The method of claim 17 wherein the measurement of the amount of gas mixed into the solvent is converted to a first data signal, the first data signal being compared with the preset value to generate a second data signal, the second data signal determining the degree of adjustment needed to arrive at the desired amount of gas in the solution.

23. The method of claim 21 wherein the gas comprises ozone and the solvent comprises water.

24. A method for mixing a gas in a solvent to produce a solution used in the processing of a semiconductor work object, comprising:

introducing a solvent comprising water into a pressurizable mixing module at a pressure;

introducing a gas comprising ozone into the mixing module, the mixing module selectably being in communication with a process vessel for holding a work object;

allowing the solvent and gas to mix at a temperature of at least 16° C.; adjusting a pressure control mechanism to adjust the relative pressures of a gas and solvent in the mixing vessel to a level, the pressure control mechanism being located downstream of the mixing module;

allowing the ozone gas to dissolve in the solvent to reach a level of at least 5 ppm; and transferring the solvent having at least 6 ppm ozone into the process vessel.

25. The method of claim 24 wherein the temperature at which the gas and solvent are mixed in the mixing module is a least 19° C.

26. The method of claim 24 wherein the temperature at which the gas and solvent are mixed in the mixing module is at least 22° C.

27. The method of claim 24 wherein the temperature at which the gas and solvent are mixed in the mixing module is at least 25° C.

28. The method of claim 24 wherein the temperature at which the gas and solvent are mixed in the mixing module is at least 28° C.

29. The method of claim 24 wherein the temperature at which the gas and solvent are mixed in the mixing module is at least 31° C.

30. The method of claim 24 wherein the temperature at which the gas and solvent are mixed in the mixing module is at least 22° C. and less than 75° C.

31. The method of claim 24 wherein the temperature at which the gas and solvent are mixed in the mixing module is between about 20° C.–35° C.

32. The method of claim 24 wherein the pressure of the solvent and the pressure control valve are adjusted to produce a solvent having at least 8 ppm of ozone in the solvent.

33. The method of claim 24 wherein the pressure of the solvent and the pressure control valve are adjusted to produce a solvent having at least 12 ppm of ozone in the solvent.

34. The method of claim 24 wherein the pressure of the solvent and the pressure control valve are adjusted to produce a solution having at least 16 ppm of ozone in the solvent.

35. The method of claim 24 wherein the pressure of the solvent and the pressure control valve are adjusted to produce a solution having at least 20 ppm of ozone in the solvent.

36. The method of claim 24 wherein the temperature at which the gas and solvent are mixed in the mixing module is at least 15° C. and wherein the pressure of the solvent and the pressure control valve are adjusted to produce a solution having at least 8 ppm of ozone in the solvent.

37. The method of claim 24 wherein the temperature at which the gas and solvent are mixed in the mixing module is at least 19° C. and wherein the pressure of the solvent and the pressure control valve are adjusted to produce a solution having at least 12 ppm of ozone in the solvent.

38. The method of claim 24 wherein the temperature at which the gas and solvent are mixed in the mixing module is between 20° C. and 35° C. and wherein the pressure of the solvent and the pressure control valve are adjusted to produce a solution having at least 16 ppm of ozone in the solvent.

39. The method of claim 24 wherein bubbles are visibly present in the solvent being introduced into the process vessel.

40. A system for treating a semiconductor substrate comprising:
a mixing module, a process vessel, an ozone gas supply unit, and a solvent source; the mixing module being pressurizable and selectably in communication with the gas-supply unit, the solvent source, and the process vessel; and a pressure control mechanism for regulating the back pressure of a solution flowing from the mixing module into the process vessel.

41. The system of claim 40 wherein the mixing module comprises a mixing tube and a debubbler.

42. The system of claim 40 wherein the mixing tube comprises a gas contactor having a PTFE membrane compartment for receiving a solvent.

43. The system of claim 40 further comprising a pressure relief mechanism associated with the mixing module.

44. The system of claim 40 wherein the pressure relief mechanism comprises a valve.

45. The system of claim 40 further comprising a gas analyzer associated with the process vessel for measuring the amount of gas dissolved in the solution.

46. The system of claim 40 further comprising a pressure sensor associated with the mixing module for measuring the partial pressure of gas in the mixing module.

47. The system of claim 40 further comprising a control unit for receiving input from at least one of a pressure sensor for measuring the partial pressure of gas in the mixing module and a gas analyzer for measuring the amount of a gas dissolved in a solvent; said control unit being adapted to process the input and to generate a data signal.

48. The system of claim 47 wherein the control unit is selectably in communication with a device associated with the system for adjusting flow or pressure of system components.

49. The system of claim 48 wherein the device is at least one of a pressure control mechanism, a pressure relief mechanism, and a flow control mechanism regulating flow of solvent into the mixing module.

* * * * *